US012811045B2

(12) United States Patent
Singh et al.

(10) Patent No.: US 12,811,045 B2
(45) Date of Patent: Nov. 24, 2026

(54) FIELD-FREE SPIN-ORBIT TORQUE SWITCHING OF PERPENDICULARLY POLARIZED MAGNETS

(71) Applicant: CARNEGIE MELLON UNIVERSITY, Pittsburgh, PA (US)

(72) Inventors: Simranjeet Singh, Pittsburgh, PA (US); Jyoti Katoch, Pittsburgh, PA (US); I-Hsuan Kao, Pittsburgh, PA (US); Ryan Muzzio, Pittsburgh, PA (US)

(73) Assignee: CARNEGIE MELLON UNIVERSITY, Pittsburgh, PA (US)

( * ) Notice: Subject to any disclaimer, the term of this patent is extended or adjusted under 35 U.S.C. 154(b) by 734 days.

(21) Appl. No.: 18/022,430

(22) PCT Filed: Nov. 22, 2021

(86) PCT No.: PCT/US2021/060345

§ 371 (c)(1),
(2) Date: Feb. 21, 2023

(87) PCT Pub. No.: WO2022/115379

PCT Pub. Date: Jun. 2, 2022

(65) Prior Publication Data

US 2023/0335325 A1 Oct. 19, 2023

Related U.S. Application Data

(60) Provisional application No. 63/119,044, filed on Nov. 30, 2020.

(51) Int. Cl.
*H01F 10/32* (2006.01)
*G11C 11/16* (2006.01)
(Continued)

(52) U.S. Cl.
CPC ........ *H01F 10/3286* (2013.01); *G11C 11/161* (2013.01); *H10B 61/00* (2023.02); *H10N 50/85* (2023.02); *H10N 52/80* (2023.02)

(58) Field of Classification Search
None
See application file for complete search history.

(56) References Cited

U.S. PATENT DOCUMENTS

| | | | |
|---|---|---|---|
| 9,105,832 B2 | 8/2015 | Buhrman et al. | |
| 11,069,390 B2 * | 7/2021 | Hu | H01F 10/3281 |
| 2020/0075073 A1 | 3/2020 | Sasaki | |

OTHER PUBLICATIONS

Hwang et al. "Hard ferromagnetic van-der-Waals metal (Fe, Co)3GeTe2: a new platform for the study of low dimensional magnetic quantum criticality," J. Phys. Condens.Matter 31 (2019) Sep. 30, 2019 Https://iopscience.iop.org/article/10.1088/1361-648X/ab3135.

(Continued)

*Primary Examiner* — Nilufa Rahim
(74) *Attorney, Agent, or Firm* — KDW FIRM PLLC

(57) ABSTRACT

Disclosed herein are devices and method for realizing field-free deterministic switching of a perpendicularly polarized magnet using SOTs in a quantum material with low-symmetry crystal structure. In preferred embodiments, SOT devices are fabricated using a perpendicularly polarized van der Waals (vdW) based layered quantum material platform and thin films of $WTe_2$ are used as a spin-source material for generating the SOTs for magnetic memory and spin logic devices.

9 Claims, 12 Drawing Sheets

(51) Int. Cl.

| | |
|---|---|
| ***H10B 61/00*** | (2023.01) |
| ***H10N 50/85*** | (2023.01) |
| ***H10N 52/80*** | (2023.01) |

(56) References Cited

OTHER PUBLICATIONS

Kao et al., "Field-free deterministic switching of a perpendicularly polarized magnet using unconventional spin-orbit torquesin WRe2," arXiv: 2012, 12388v1 (cond-mat.med-hall) Dec. 22, 2020 https://arxiv.org/abs/2012.12388.

MacNeill et al. "Control of Spin Orbit torques through crystal symmetry in WTe 2/ferromagnet bilayers," Nature Physics 13.3 (2017): 300-305.

International Search Report and Written Opinion mailed Feb. 8, 2022, for PCT/US2021/060345 filed Nov. 22, 2021.

* cited by examiner

FIELD-FREE SPIN-ORBIT TORQUE SWITCHING OF PERPENDICULARLY POLARIZED MAGNETS

RELATED APPLICATIONS

This application claims the benefit of U.S. Provisional Patent Application No. 63/119,044, filed Nov. 30, 2020, the contents of which are incorporated herein in their entirety.

GOVERNMENT INTEREST

This invention was made with United States government support under award DMR-2011876 (sub-award 60077667) from the National Science Foundation. The U.S. government has certain rights in the invention.

BACKGROUND

Spin-Orbit Torque (SOT) is an efficient means of manipulating the magnetic state of ferromagnetic (FM) materials. The technological applications based on SOT-driven magnetization manipulation includes energy efficient non-volatile magnetic memories and spin-torque oscillators. In SOT-induced magnetic switching, a charge current density flowing in the plane (x-direction) of a bilayer structure consisting of spin-source material and a FM material results in a spin current flowing in the out-of-plane direction (z direction) via spin galvanic effects. This spin current, in turn, exerts a torque on the magnetization of a nearby magnetic layer. This torque has an antidamping component $$(\vec{\tau}_{AD})$$

and a field-like component $$(\vec{\tau}_{FL}).$$

Due to the symmetry of bilayer heterostructures consisting of a heavy metal layer and a ferromagnetic layer (HM/FM), the spin is polarized in the y-direction and the in-plane anti-damping torque $$(\vec{\tau}_{IP}^{AD})$$

can only deterministically switch the magnetization of a magnet that has an in-plane magnetic anisotropy.

However, for memory applications, magnets with perpendicular magnetic anisotropy (PMA) are highly desired because they allow for ultra-compact packing and thermally stable nanometer sized magnetic bits. In conventional HM/FM systems, a small external magnetic field is applied along the direction of the charge current to break the in-plane symmetry of the system, thereby allowing for the deterministic switching of the magnetization state of the PMA magnet. FIG. 1 shows a prior art SOT device which requires an external biasing magnetic field $B_{ext}$ to flip the direction of the magnetization of the ferromagnetic component.

It would be desirable, however, to be able to deterministically switch the magnetization state of the PMA magnet without the need for biasing with an external magnetic field.

SUMMARY OF THE INVENTION

Disclosed herein is a device and method of performing the deterministic switching of the magnetization state of a PMA magnet using out-of-plane antidamping SOT in layered materials with low symmetry crystal structure without the need for an external biasing magnetic field.

In certain materials, unconventional form of SOTs are allowed by crystal symmetries. Transition metal dichalcogenides with low symmetry crystal structure, such as tungsten ditelluride ($WTe_2$), exhibit an out-of-plane antidamping torque $(\vec{\tau}_{OP}^{AD})$ when a charge current is applied along the low symmetry axis of a $WTe_2$/FM bilayer system.

The devices and method disclosed herein realize field-free deterministic switching of a perpendicularly polarized magnet using SOTs in a quantum material with low symmetry crystal structure. In preferred embodiments, SOT devices are fabricated using a perpendicularly polarized van der Waals (vdW) based layered quantum material platform. Thin films of $WTe_2$ are used as a spin-source material for generating the SOTs.

DETAILED DESCRIPTION

The disclosed invention includes a method for deterministically switching a perpendicularly polarized PMA using SOTs in a quantum material having low-symmetry crystal structure, and exemplary devices embodying the method. The SOT devices disclosed herein are fabricated using a vdW-based layered quantum material platform. Thin films of $WTe_2$ are used as a spin-source material for generating the SOTs.

In addition to being able to generate the required out-of-plane antidamping torque, $WTe_2$ also exhibits properties that are highly relevant for a large charge-to-spin conversion efficacy, namely, strong spin-orbit coupling, non-trivial band dispersion, topologically protected spin polarized bulk and surface states, pronounced Edelstein effect and an intrinsic spin Hall effect.

Figure 1:
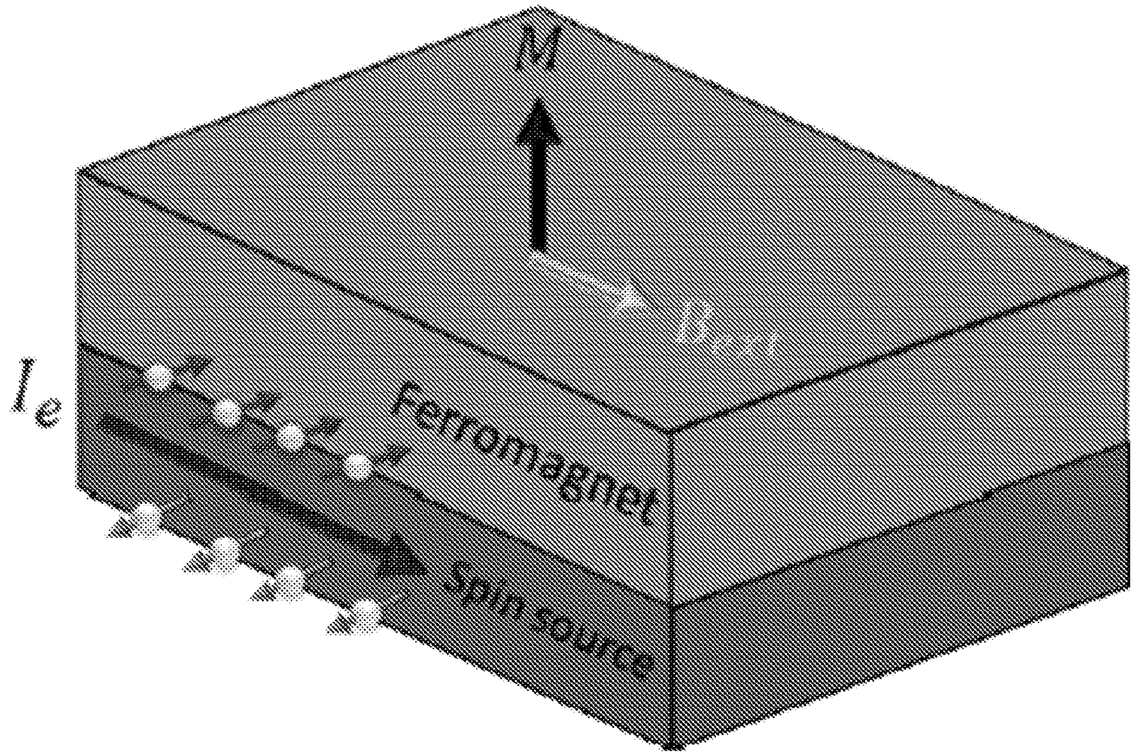
FIG. 1 (Prior Art)
FIG. 1 is a schematic depiction of a prior art device requiring an external biasing magnetic field.
Figure 2A:
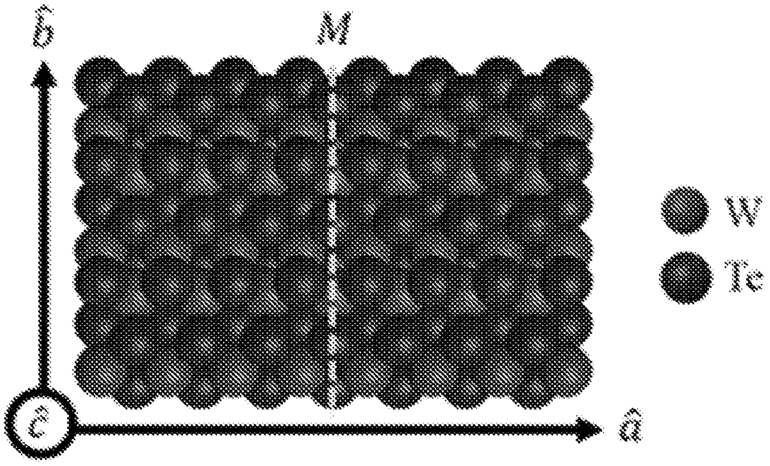
FIGS. 2A, 2B, 2C are a schematic depiction of a top view (ab plane), side view of (ac plane), and sideview (bc plane) respectively of a layer of $WTe_2$, a material with low symmetry crystal structure
Figure 2B:
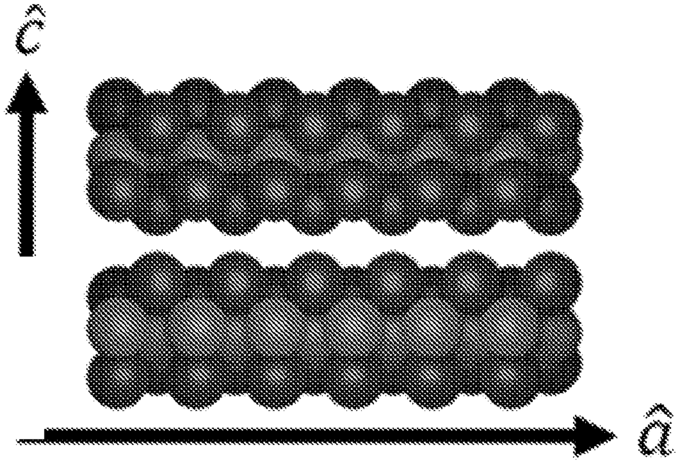
Figure 2C:
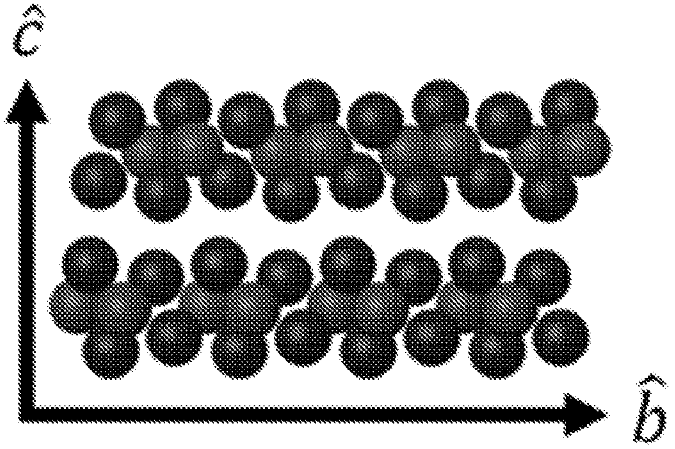

WTe2 is a low-symmetry system, having an ab-plane which is schematically depicted in FIG. 2A, wherein the c-axis is normal to the ab-plane. The model shows the crystal structure of $WTe_2$ with the a-axis, b-axis, and c-axis labeled. The crystal is invariant with respect to a mirror operation about the bc-plane but noninvariant with respect to a mirror operation about the ac-plane. That is, the surface of $WTe_2$ only has mirror symmetry with respect to the bc-plane but not with respect to the ac-plane. Thus, the system is asymmetric relative to a 180° rotation about the c-axis. FIG. 2B and FIG. 2C shows a schematic representation of $WTe_2$ showing the low-symmetry crystal structure in ac-plane and bc-plane respectively.

For the PMA magnet, $Fe_{2.78}GeTe_2$ (FGT) is used, which is a layered vdW FM material. Mechanical dry transfer techniques to assemble $WTe_2$/FGT bilayers and standard device fabrication techniques are used to prepare the SOT devices.

Figure 3A:
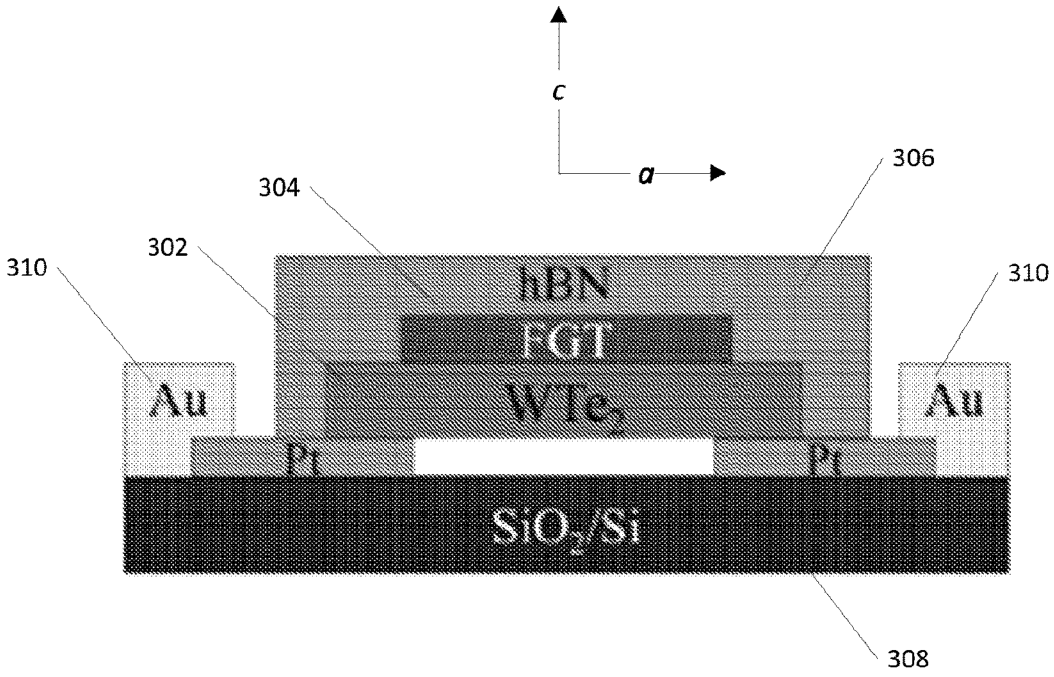
FIGS. 3A, 3B are a side schematic view and a top optical view of an exemplary device, respectively.

FIG. 3A is a side schematic view of an exemplary device constructed in accordance with the disclosed embodiments. To fabricate the device, $WTe_2$ 302, FGT 304, and hexagonal boron nitride (h-BN) 306 crystal flakes were prepared by known procedures. The $WTe_2$, h-BN, and FGT were mechanically exfoliated on separate SiO2/Si (300 nm) substrates inside an Argon glovebox environment. The flakes were then optically searched and selected using a fully automated microscope inside the glovebox. On a separate substrate 308, electrodes 310 were defined using standard electron beam lithography with bilayer resist and electron beam deposition was used for platinum and gold electrodes. The electrodes 310 are set up to apply current pulses along the a-axis and b-axis of $WTe_2$ 302. The heterostructure was made using a custom-built transfer tool inside the glovebox using a polydimethylsiloxane (PDMS) stamp and thin film of polycarbonate (PC). The final device consists, from top to bottom, of h-BN 306, FGT 304, $WTe_2$ 302 and Pt with Cr(5 nm)/Au(110 nm) bond pads 310 on an SiO2/Si substrate 308. An optical image of an exemplary device is shown in FIG. 3B.

Figure 3B:
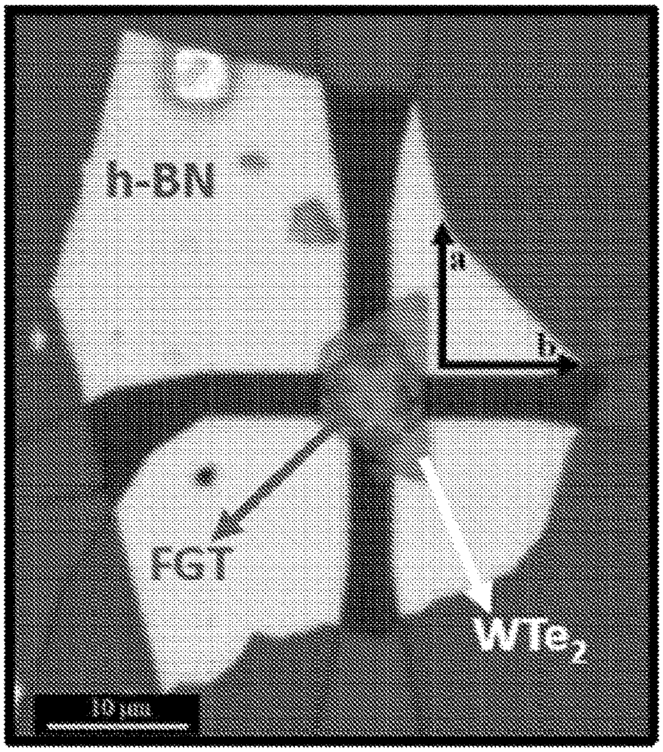
Figure 4:
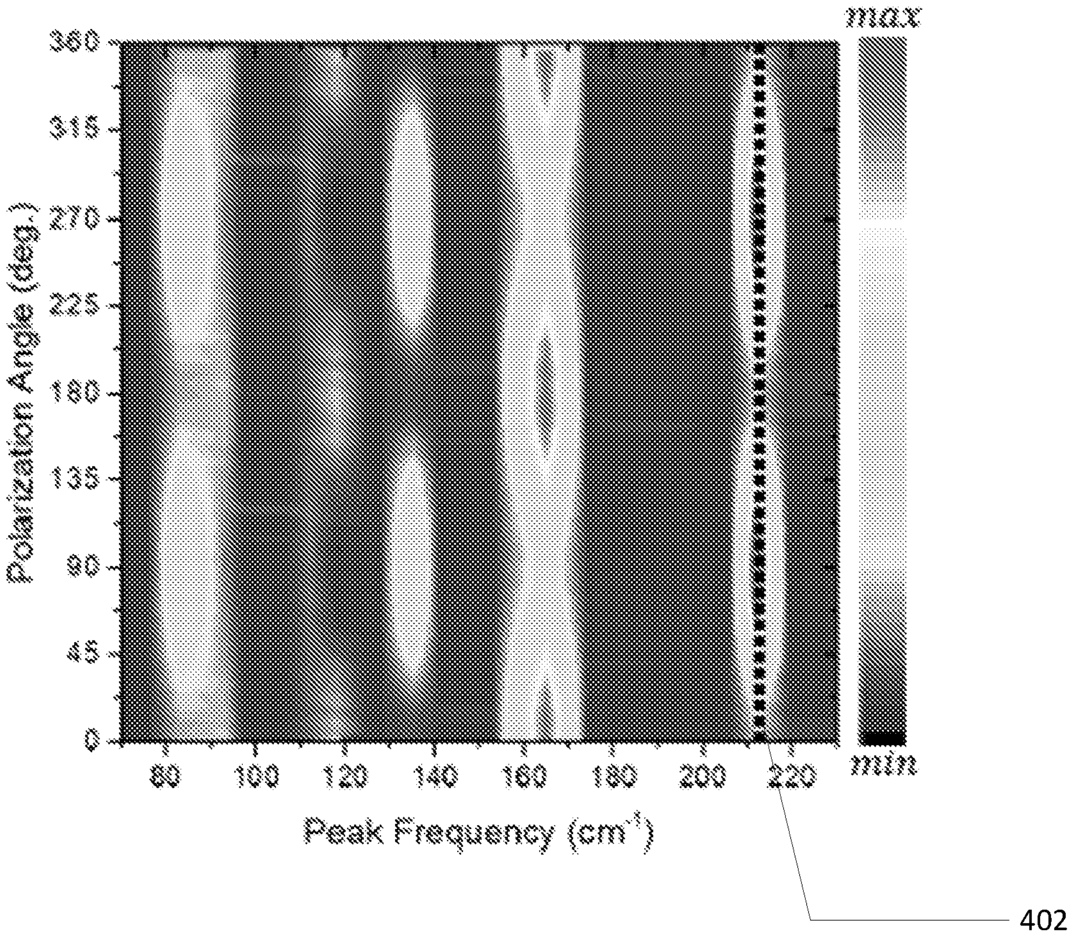
FIG. 4 is a contour plot showing the angle-dependent polarized Raman spectral intensity.

In the exemplary fabricated device shown in FIG. 3B, the crystallographic a-axis and b-axis are labeled and confirmed by polarized Raman spectroscopy. Raman spectra are collected by rotating the polarization of the incident laser for different angles relative to the a-axis of $WTe_2$ and the integrated intensities under each peak are calculated for the contour plot shown in FIG. 4. The polarization angle dependence of the Raman peak at 212 $cm^{-1}$ (corresponding to the black dashed line 402 in FIG. 4) exhibits minimum intensity when the excitation laser polarization is along the straight edge of the $WTe_2$ 302 flake. This clearly distinguishes the a-axis of the $WTe_2$ flake.

Figure 5:
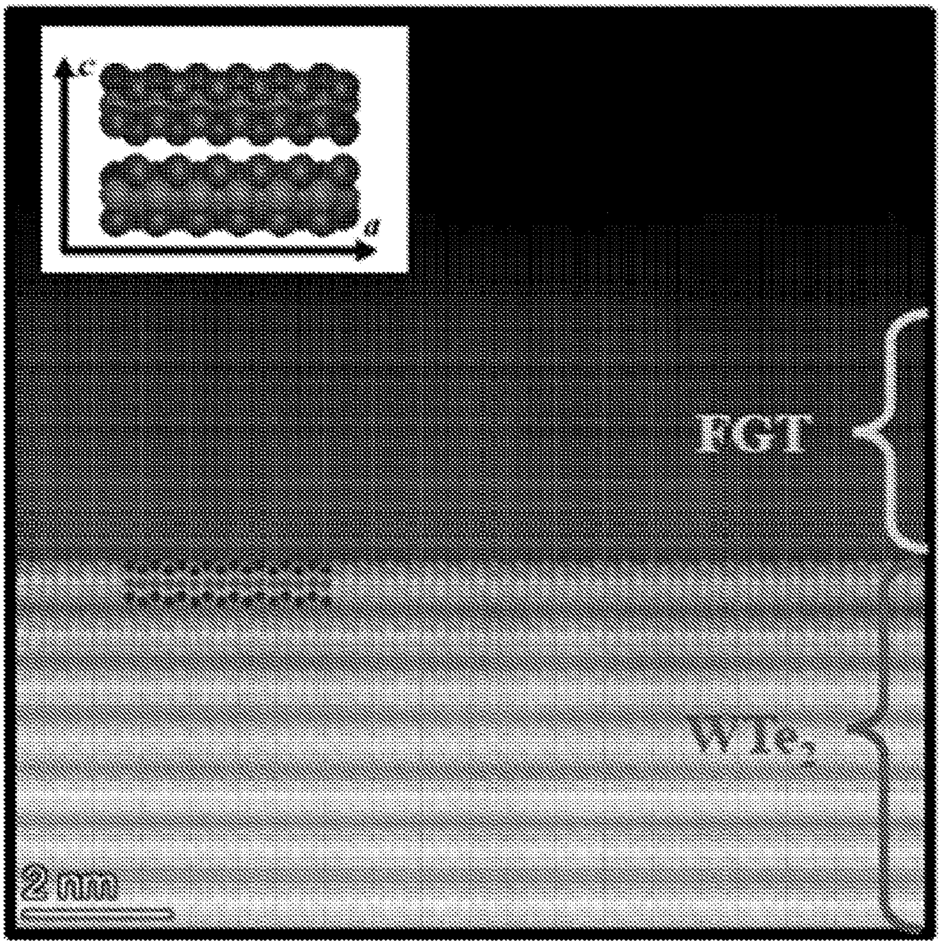
FIG. 5 is a cross-sectional STEM image of an exemplary device.

FIG. 5 shows a cross-sectional scanning transmission electron microscopy (STEM) image of the exemplary device as viewed along the b-axis orientation of $WTe_2$ 302, which confirms that the lateral direction is the a-axis of $WTe_2$ 302 consistent with the orientation determined by the Raman spectra. The inset of FIG. 5 schematically shows the atomic arrangement of $WTe_2$ 302 in the ac-plane in comparison to the STEM image.

Figure 6:
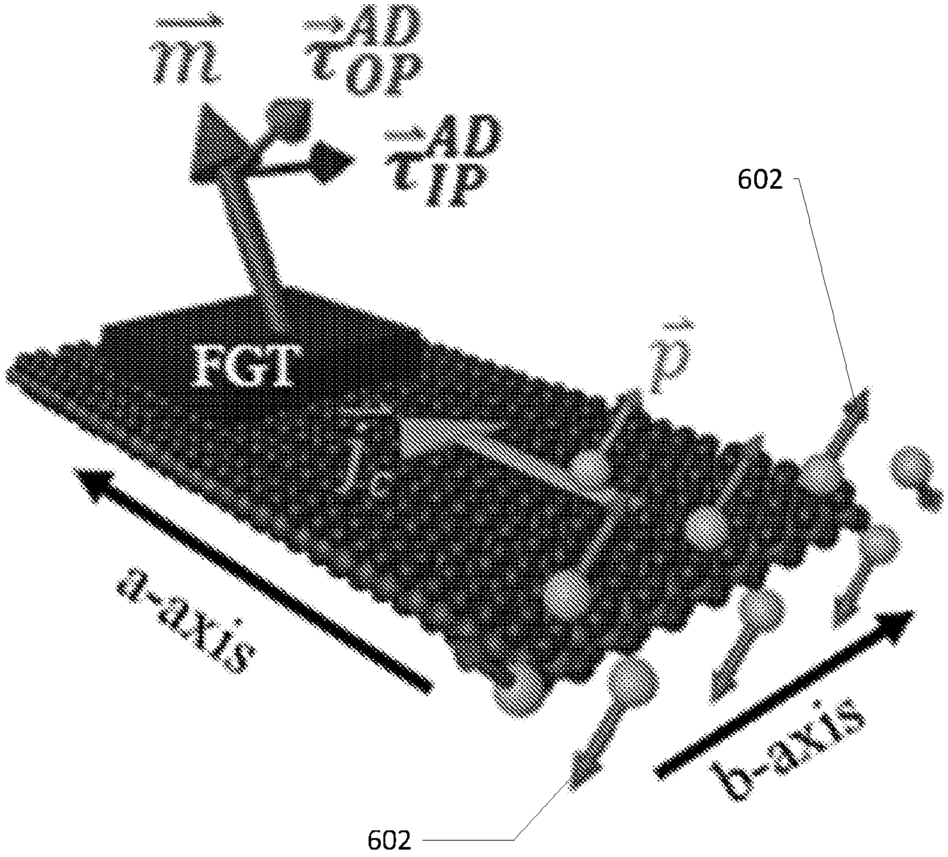
FIG. 6 is a schematic diagram showing allowed forms of anti-damping SOT when a charge is applied along the a-axis of an exemplary device.

Previously, the presence of a strong out-of-plane antidamping torque $$(\vec{\tau}_{OP}^{AD})$$

in a $WTe_2$/Py heterostructure was probed by spin torque ferromagnetic resonance. The out-of-plane antidamping torque is independent of the reversal of magnetization, reverses with current direction, and can efficiently switch a perpendicular magnetization. The out-of-plane antidamping torque is not allowed in conventional spin source systems, such as heavy metals and topological insulators, due to 2-fold rotational symmetry. However, this symmetry is broken in $WTe_2$. Specifically, $WTe_2$ has no mirror symmetry in the ac-plane (FIG. 2), allowing for a non-zero out-of-plane antidamping torque when a charge current is applied along the a-axis of $WTe_2$, as shown in FIG. 6, which is a schematic showing the allowed forms of anti-damping SOTs depending on whether a charge current is applied along the a-axis. When a charge current is applied along the a-axis, there is an out-of-plane component of the spin polarization as shown by arrows 602 in FIG. 6.

Figure 7:
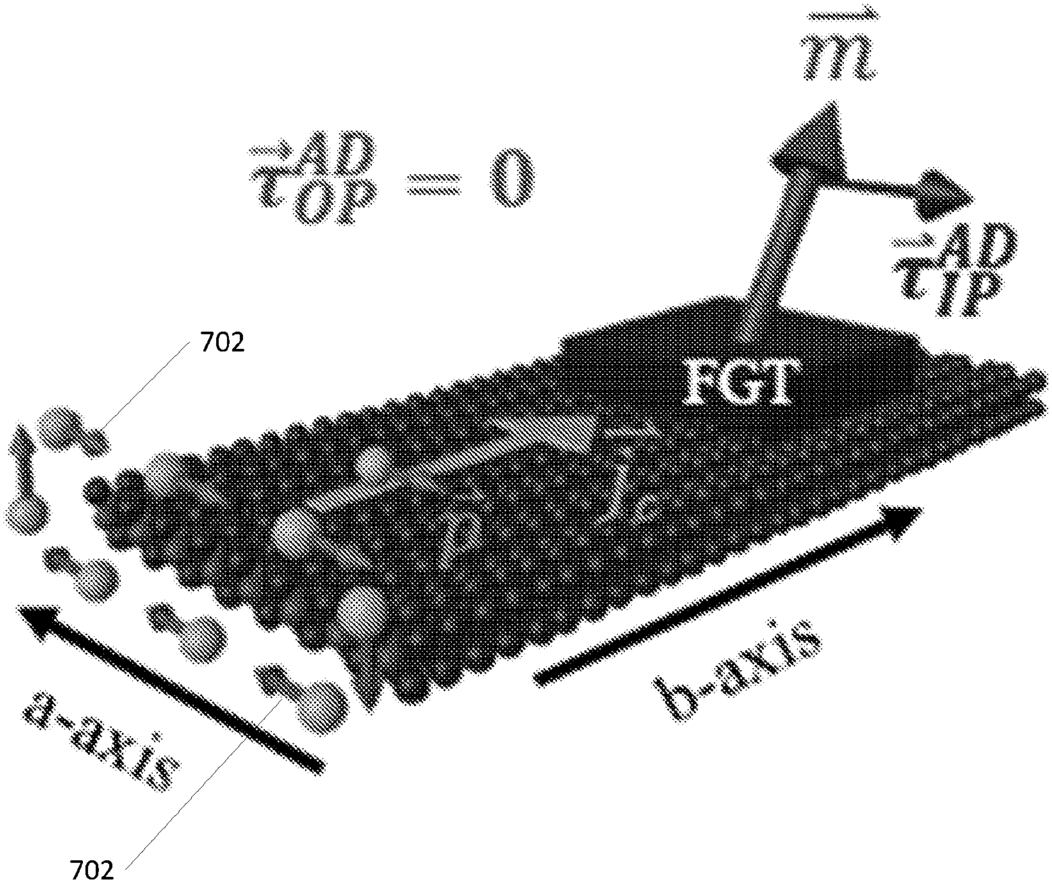
FIG. 7 is a schematic diagram showing allowed forms of anti-damping SOT when a charge is applied along the b-axis of an exemplary device.

On the other hand, when a charge current is applied along the b-axis of $WTe_2$, the preserved mirror symmetry in the bc-plane of $WTe_2$ requires that the out-of-plane antidamping torque equal 0 as depicted in FIG. 7. Essentially, when a current is applied along the b-axis and a bc-plane mirror operation is performed, the current does not switch direction (i.e., I→−I), but the out-of-plane antidamping torque (a pseudovector) will change sign $$\left(\text{i.e., } \vec{\tau}_{OP}^{AD} \rightarrow -\vec{\tau}_{OP}^{AD}\right).$$

But a current-induced spin orbit torque must change sign with current reversal, requiring that the out-of-plane antidamping torque equal 0 when current flows along the b-axis. In other words, when charge current is applied along b-axis, there is only an in-plane component of spin polarization as shown by arrows 702 in FIG. 7.

To examine the presence of the out-of-plane antidamping torque, anomalous Hall effect (AHE) loop shift measurements were performed on the exemplary device, as described below. An out-of-plane antidamping torque can abruptly shift the AHE hysteresis loop once the current passes a threshold value such that the intrinsic damping is compensated. When $$\vec{I}\|\hat{a},$$

Figure 8A:
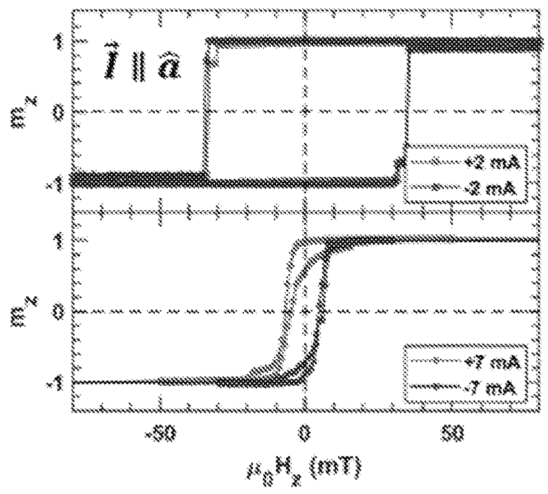
FIGS. 8A, 8C are graphs showing the AHE hysteresis loops while a charge current is applied along the a-axis and b-axis of an exemplary device, respectively.
Figure 8B:
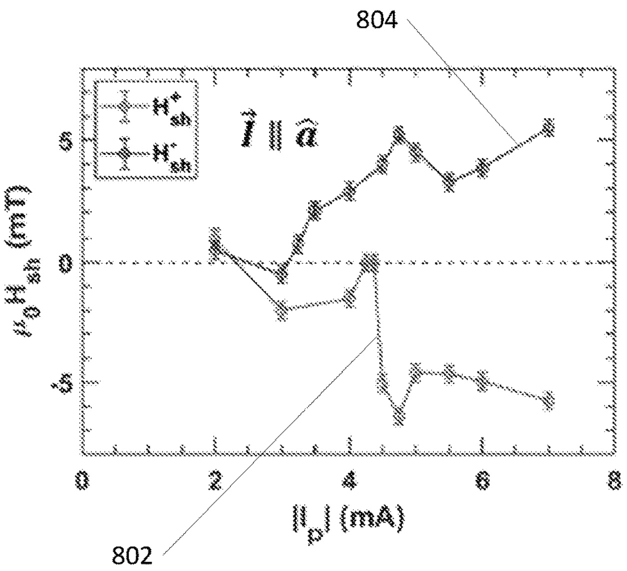
FIGS. 8B, 8D are graphs showing the magnitude of the loop shift field as a function of charge current amplitude for positive and negative charge currents applied along the a-axis and b-axis of an exemplary device, respectively.
Figure 8C:
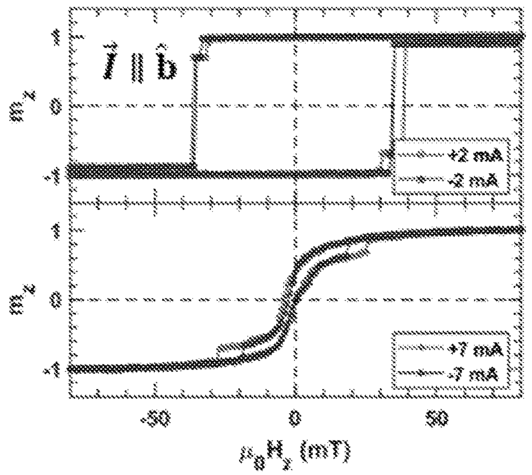
Figure 8D:
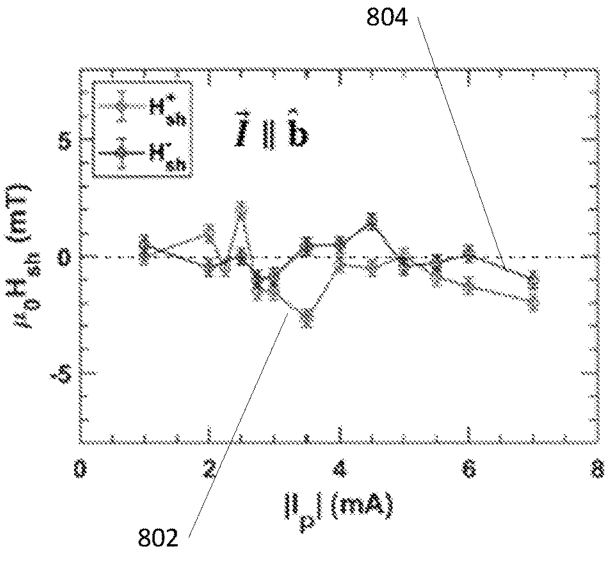

AHE hysteresis loops measured at low pulse currents ($I_p$=±2 mA) look identical for different current polarity as shown in the upper panel of FIG. 8A. However, when $I_p$ increases to +7 mA, the AHE loop shifts to the negative field values (or positive field values when $I_p$ increases to +7 ma), as shown in the lower panel of FIG. 8A. On the other hand, when $I_p$ is applied along the b-axis, no significant loop shift is observed for both low and high current pulse magnitudes, as shown in FIG. 8C. The measurements are repeated at different charge current magnitudes for $$\vec{I}\|\hat{a}$$

and $$\vec{I}\|\hat{b}$$

and are shown in FIGS. 8B, 8D respectively. When $$\vec{I}\|\hat{a},$$

a threshold current effect in $H_{sh}(|I_p|)$ and a clear splitting between $$H_{sh}^{+}$$

and $$H_{sh}^{-}$$

at higher currents is observed, where $$H_{sh}^{+}\ 802$$

802 is the loop shift field measured at positive currents and $$H_{sh}^{-}\ 804$$

804 is the loop shift field measured at negative currents. The observed asymmetry in $H_{sh}(|I_p|)$ for positive and negative currents is believed to be due to the fact that the device is not patterned into an ideal Hall cross geometry. In contrast, for $$\vec{I}\|\hat{b},\ H_{sh}(|I_p|)$$

$H_{sh}(|I_p|)$ shows very weak $I_p$ dependence and remains close to zero for low and high current values. These results clearly show the presence of a non-zero out-of-plane antidamping torque when current is applied along a-axis. The abrupt shift, instead of a linear shift, in $H_{sh}$ for $$\vec{I}\|\hat{a}$$

also indicates that no significant out-of-plane field-like torque is present in the system.

The method for performing the AHE loop shift measurements on the exemplary device will now be described. The electrical measurements were performed at variable temperatures in high vacuum (pressure$<10^{-5}$ mTorr) conditions. An electromagnet was rotated such that the magnetic field can be applied in both in- and out-of-plane directions of the device. A current source and a nanovoltmeter are used for AHE hysteresis loop and current pulse-induced SOT switching experiments. The current pulse used is a square current pulse with varying magnitude and a width of 100 μs. The transverse resistance, $R_{xy}$, is measured with a smaller magnitude current (50 μA) in delta mode to determine the magnetization state of FGT. The normalized perpendicular magnetization is defined as $$m_z = \frac{M_z}{M_s} = \frac{R_{xy}}{R_{AHE}},$$

where $M_z$ is the perpendicular magnetization, and $M_s$ is the saturation magnetization. In the SOT measurements, the initial magnetic state is prepared in $m_z$=±1 (using an external magnetic field) and $I_p$ is swept from zero to positive or negative maximum values in steps of 250 μA. The threshold current is defined as $$I_{th} = \frac{I_{th}^{+} + I_{th}^{-}}{2},$$

where $$I_{th}^{+} \text{ or } I_{th}^{-}$$

is the pulse current magnitude that drives the magnetization state across $m_z$=0 at positive or negative pulse sides, respectively. For SOT switching with pulse trains, a series of read current pulses of 500 μA were applied to read the magnetization state before and after the write current pulse was applied. AHE loop shift measurements are performed by measuring $m_z(H_z)$, where at each perpendicular field $H_z$ a pulse current $I_p$ (500 μs long) is applied and $m_z$ is measured simultaneously in pulse delta mode. The loop shift field of the loop is defined as $$H_{sh} = [H_c^{+} + H_c^{-}]/2,$$

where $$H_c^+ \ (H_c^-)$$

is the magnetic field for which the magnetization switches from down to up (up to down).

Figure 9A:
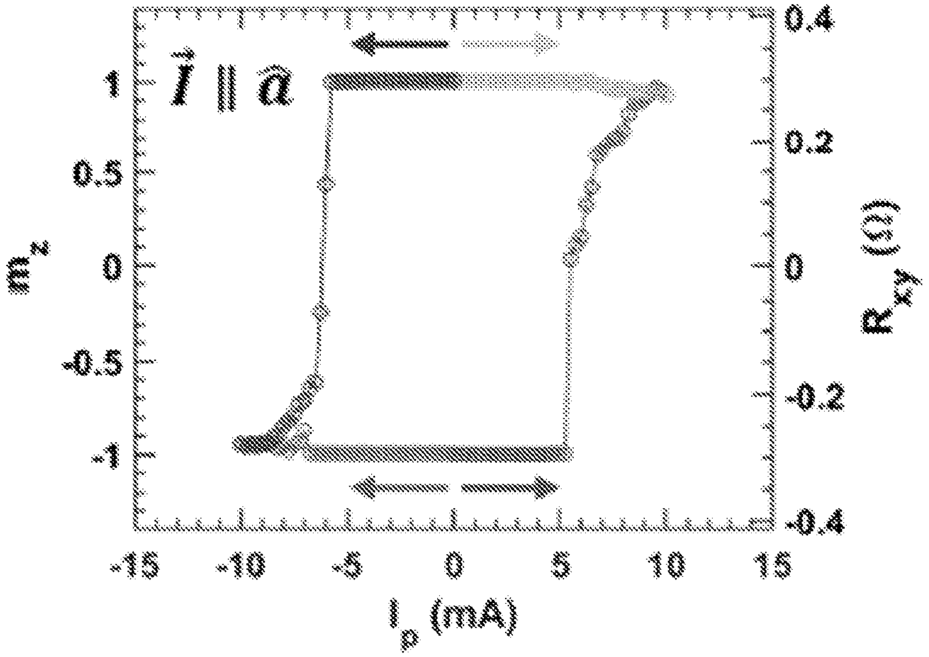
FIG. 9A is a graph showing deterministic switching when a current is applied along the direction of the a-axis of an exemplary device.

The field-free switching of the perpendicular magnetization of the FGT is demonstrated by employing charge current induced SOTs in $WTe_2$. When a charge current pulse ($I_p$) is applied along the a-axis (i.e., $$\left(\text{i.e., } \vec{I} \| \hat{a}\right),$$

clear deterministic switching is observed, as shown in FIG. 9A, which shows that the terminal state is determined by the polarity of $I_p$ (i.e., a positive current favors magnetization pointing up and a negative current favors magnetization pointing down). The deterministic switching of FGT is attributable to the out-of-plane antidamping torque generated due to $p_z$ in $WTe_2$.

Figure 9B:
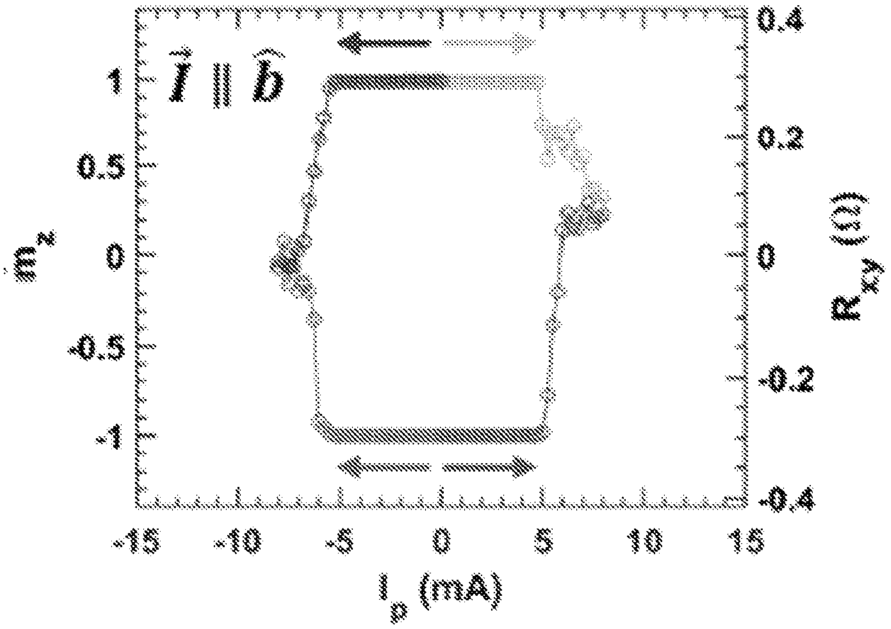
FIG. 9B is a graph showing no deterministic switching when a current is applied along the direction of the b-axis of an exemplary device.
Figure 10A:
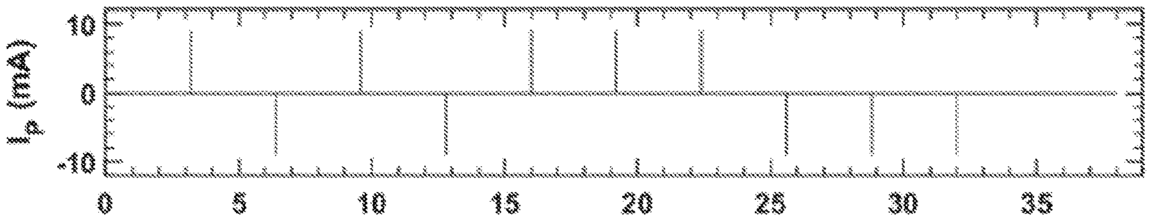
FIGS. 10A, 10B are graphs showing the deterministic switching of the exemplary device by a series of current pulses applied along the direction of the a-axis of an exemplary device.
Figure 10B:
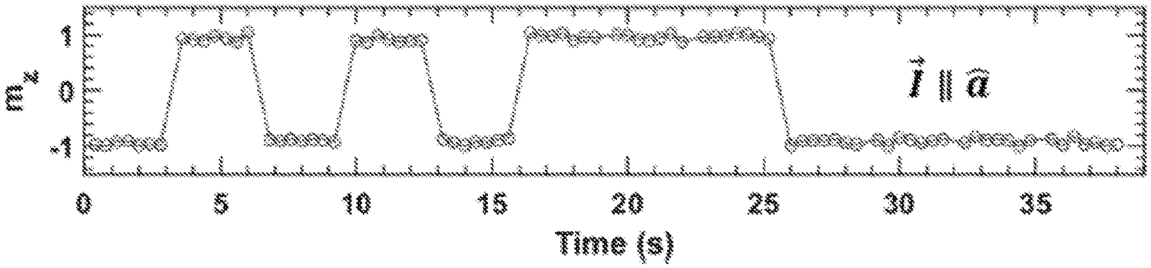
Figure 11:
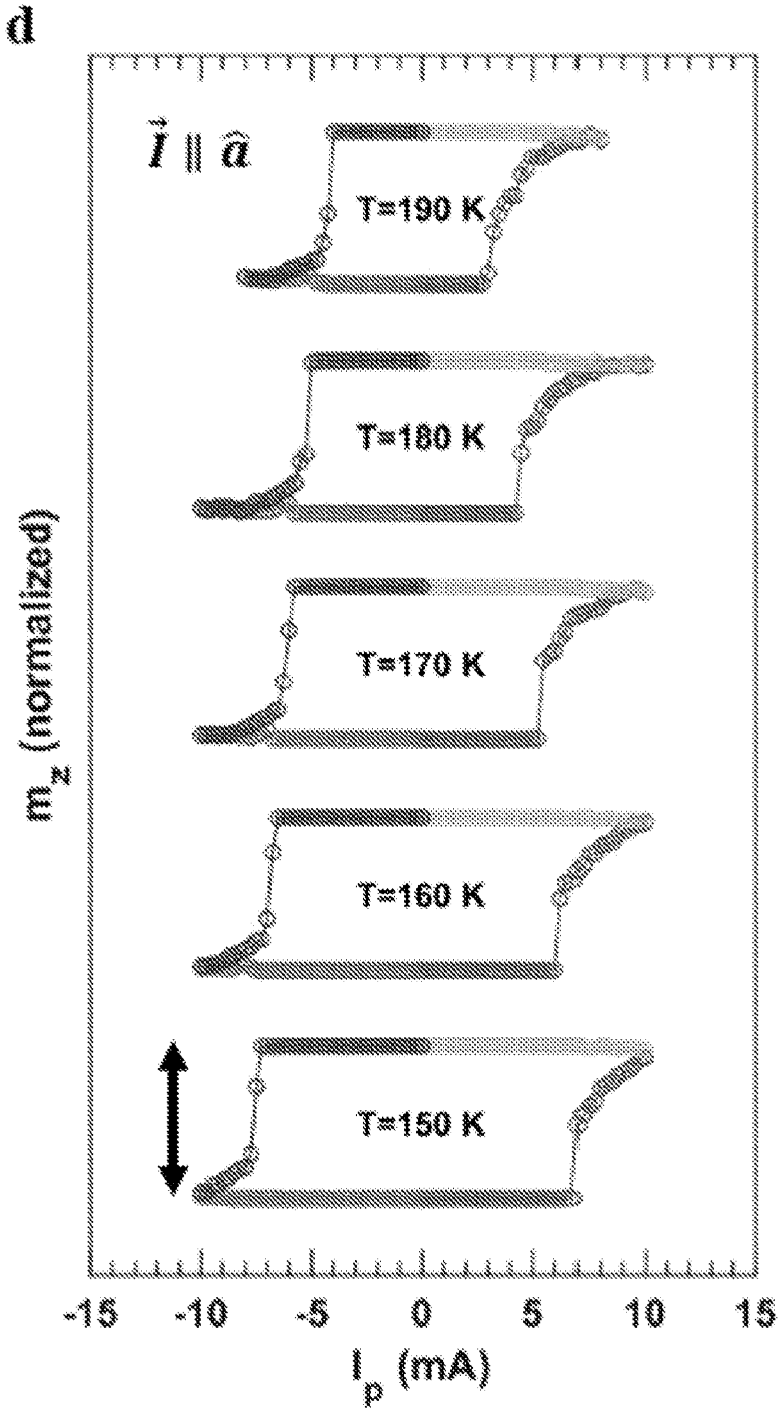
FIG. 11 is a graph showing that current-induced spin-orbit torque switching happens at various temperatures.

On the other hand, the behavior is completely different when the current is applied along the b-axis. There is no deterministic switching observed in the absence of an external in-plane magnetic field, as shown in FIG. 9B. This behavior is similar to SOT switching in conventional HM/FM bilayer systems, (i.e., the terminal state is close to the demagnetized state $m_z \approx 0$, indicating that the in-plane antidamping torque $$(\vec{\tau}_{IP}^{AD}),$$

generated by spin polarization pointing in the y-direction, drives the magnetic moment of FGT to the device plane1). Without the presence of $p_z$ (or a symmetry breaking in-plane magnetic field), multi-domains are formed after the current is turned off. Each domain is then left randomly oriented which leads to the demagnetization of FGT. Furthermore, using a train of positive and negative current pulses applied along the a-axis of $WTe_2$ as shown in FIG. 10A. The magnetic state of the FGT can be reliably and deterministically switched from up to down and vice-versa, as shown in FIG. 10B. Also, the field-free SOT switching of FGT magnetization is robust in a wider temperature range as shown in FIG. 11.

Figure 12A:
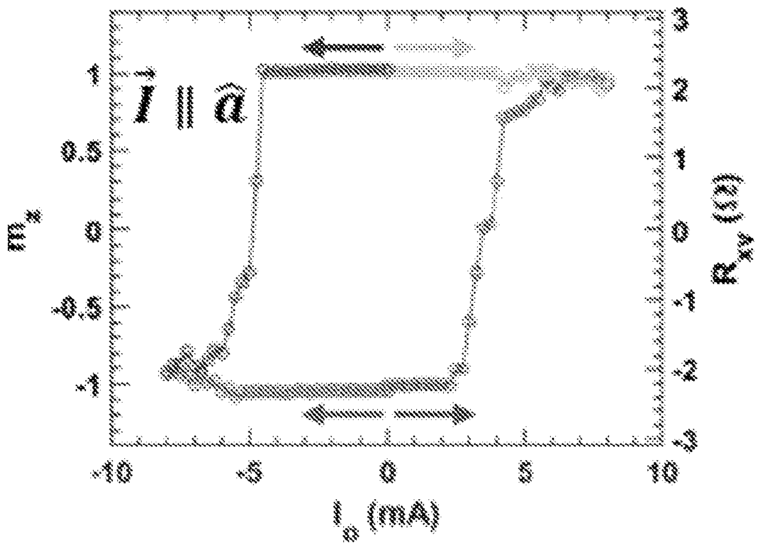
FIG. 12A is a graph showing SOT-induced field-free deterministic switching when at 160 K.
Figure 12B:
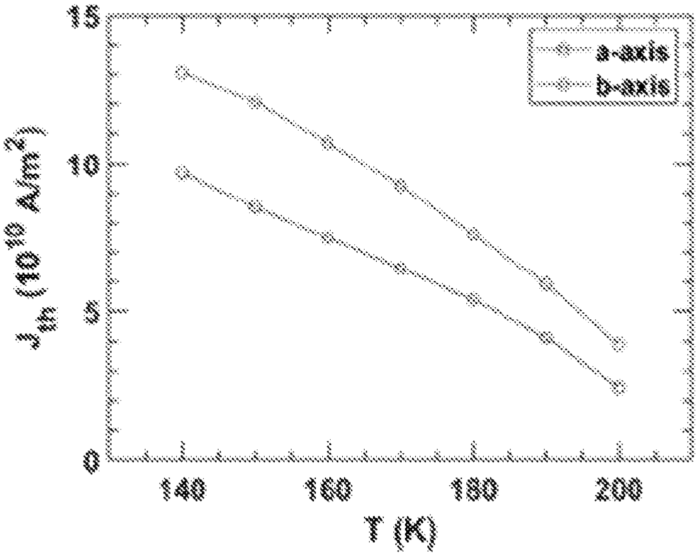
FIG. 12B is a graph showing threshold current density as a function of temperature obtained when a charge current is applied along the a-axis and b-axis of an exemplary device.
Figure 12C:
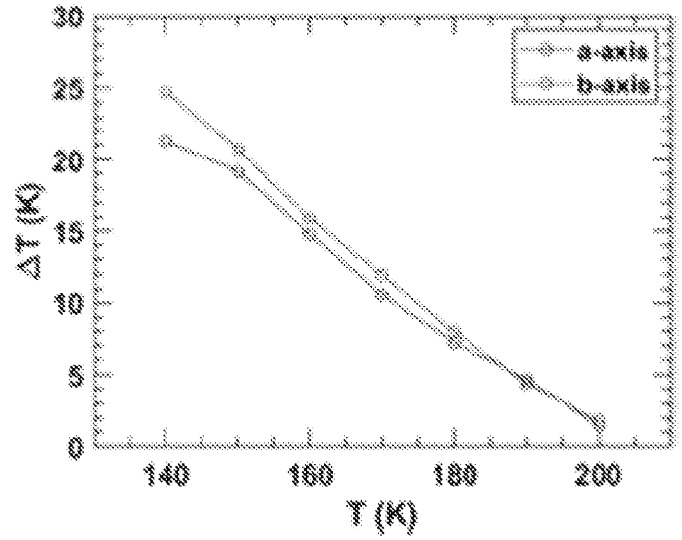
FIG. 12C is a graph showing the temperature change when current density is applied as a function of temperature when a charge current is applied along the a-axis and b-axis of an exemplary device.

Thermal effects due to Joule heating in exemplary devices disclosed herein is estimated by comparing the temperature and charge current dependent longitudinal resistance of the $WTe_2$/FGT bilayer. For this, a device having thinner $WTe_2$ (higher resistance) is used, such that a larger current flows through the FGT layer, providing a more accurate estimation of the temperature profile of magnetic layer due to Joule heating. FIG. 12A shows the field-free SOT switching observed in an exemplary device when a charge current is applied along the a-axis. Threshold current ($I_{th}$), defined as the current that switches magnetic state across $m_z=0$, is obtained at different temperatures and translated to threshold current density ($J_{th}$), considering only current flowing in $WTe_2$ for both a-axis and b-axis, as shown in FIG. 12B. $\Delta T$, which is the change in temperature of the device when the $I_{th}$ current pulse is applied, is also estimated. $\Delta T$ is higher or lower when SOT switching is performed experiments at lower or higher temperatures, respectively. At lower temperatures, FGT coercive fields are higher and require larger Joule heating (i.e., a larger $\Delta T$ value) and, hence, large currents densities to switch the magnetization, as observed in FIG. 12B. This suggests that Joule heating assists the SOT-induced magnetization reversal by lowering the energy barrier for magnetization switching.

Disclosed here in a device and method for performing field free deterministic perpendicular magnetization switching of a PMA magnet by providing an out-of-plane antidamping SOT in $WTe_2$. The presence of an out-of-plane antidamping torque make TMDs with lower symmetry crystal structure an appealing spin source material for SOT-based magnetic memory technologies.

The invention claimed is:

1. A device comprising:

a substrate;

a layer of a spin-source material disposed on the substrate, the spin-source material having a low-symmetry crystal structure with a low-symmetry axis of the spin-source material;

a plurality of electrodes defined on the substrate, the electrodes configured to allow a positive and negative flow of current along the low-symmetry axis of the spin-source material;

a ferromagnetic material having perpendicular magnetic anisotropy layered on the spin-source material; and a layer of a high-symmetry material encapsulating the spin-source material and the ferromagnetic material;

wherein the spin-source material produces an out of plane antidamping torque in an up direction when the positive current flows along the low-symmetry axis;

wherein the spin-source material produces an out of plane antidamping torque in a down direction when the negative current flows along the low-symmetry axis; and wherein the up direction and down direction anti-damping torques switch the ferromagnetic material between a first magnetic state and a second magnetic state.

2. The device of claim 1 wherein the positive current causes the up direction antidamping torque to change the magnetization of the ferromagnetic material in a first, out-of-plane direction.

3. The device of claim 1 wherein the negative current causes the down direction antidamping torque to change the magnetization of the ferromagnetic material in a second, out-of-plane direction.

4. The device of claim 1 wherein a magnetization state of the ferromagnetic material is switched without application of an external biasing magnetic field.

5. The device of claim 1 wherein the ferromagnetic material is a perpendicularly polarized van der Waals-based layered quantum material.

6. The device of claim 1 wherein the ferromagnetic material is $Fe_{2.78}GeTe_2$ (FGT).

7. The device of claim 1 wherein the spin-source material is tungsten ditelluride ($WTe_2$).

8. The device of claim 1 wherein the device acts as a one-bit memory storage unit.

9. The device of claim 1 wherein the high-symmetry material is hexagonal boron nitride (hBN).

* * * * *